United States Patent
Mori (10) Patent No.: US 6,574,106 B2
(45) Date of Patent: Jun. 3, 2003

(54) MOUNTING STRUCTURE OF SEMICONDUCTOR DEVICE

(75) Inventor: Fumio Mori, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/328,894

(22) Filed: Jun. 9, 1999

(65) Prior Publication Data

US 2001/0040791 A1 Nov. 15, 2001

(30) Foreign Application Priority Data

Jun. 10, 1998 (JP) .......................................... 10-161646

(51) Int. Cl.[7] ................................................ H05K 7/20
(52) U.S. Cl. ........................ 361/705; 257/717; 361/719
(58) Field of Search ................................ 165/80.3, 185; 257/704, 705, 710, 712, 713, 717; 361/704, 705, 710, 712, 713, 717–719; 174/252

(56) References Cited

U.S. PATENT DOCUMENTS

| | | | |
|---|---|---|---|
| 5,097,318 A | * | 3/1992 | Tanaka |
| 5,396,403 A | * | 3/1995 | Patel |
| 5,621,615 A | * | 4/1997 | Dawson |
| 5,744,863 A | | 4/1998 | Culnane et al. ............. 257/712 |
| 5,805,430 A | * | 9/1998 | Atwood |
| 5,931,222 A | * | 8/1999 | Toy |
| 5,966,290 A | * | 10/1999 | Sammakia |
| 5,969,947 A | * | 10/1999 | Johnson |
| 5,969,949 A | * | 10/1999 | Kim |
| 6,218,730 B1 | * | 4/2001 | Toy |

FOREIGN PATENT DOCUMENTS

| | | |
|---|---|---|
| EP | 0 678 917 | 10/1995 |
| JP | 5-326625 | 12/1993 |
| JP | 6-61306 | 3/1994 |
| JP | 8-148592 | 6/1996 |
| JP | 08-264688 | 10/1996 |
| JP | 9-186197 | 7/1997 |
| JP | 9-306954 | 11/1997 |

OTHER PUBLICATIONS

Hasegawa et al., "Hole Grid Array (HGA)—A New Tape Carrier Package with High Count I/0", *Proceedings of the Electronic Components and Technology Conference*, IEEE, vol. Conf. 45, 1995, pp. 38–41.

* cited by examiner

Primary Examiner—Gerald Tolin
(74) Attorney, Agent, or Firm—Sughrue Mion, PLLC (57) ABSTRACT

A mounting structure for a semiconductor device of the present invention includes a substrate, a semiconductor device, a plurality of connecting members and a member. The substrate has a first surface and a plurality of pads on the first surface. The semiconductor device has first and second main surfaces and a plurality of terminals provided, on the second main surface, at locations corresponding to the pads. The connecting members connect the pads to the terminals, respectively. The member has at least one surface which is coupled to the first main surface. The thermal expansion coefficient of the member is equal to, or substantially equal to, that of the substrate. A method for mounting a member and a semiconductor device on a substrate, wherein the member having at least one surface and the thermal expansion coefficient which is equal to or substantially equal to that of the substrate, includes coupling a surface of the member to the upper surface of the semiconductor device; positioning the semiconductor device so that terminals on the lower surface of the semiconductor device face pads on an upper surface of the substrate through connecting members, respectively; and heating the semiconductor device, the member, and the substrate to melt the connecting members, and thereafter, putting them back to ordinary temperature.

12 Claims, 6 Drawing Sheets

MOUNTING STRUCTURE OF SEMICONDUCTOR DEVICE

BACKGROUND OF THE INVENTION

The present invention relates to a mounting structure and a method of mounting a semiconductor device, and more particularly, to a mounting structure and a method of mounting a semiconductor device in which a semiconductor device and a mounting substrate having different thermal expansion coefficients are connected to each other by connecting members.

A conventional mounting structure for a semiconductor device of this kind is, for example, a flip chip connecting structure. In flip chip connecting structure, a semiconductor device is connected to a mounting substrate with solder or conductive adhesive. More specifically, in the structure, a plurality of input/output terminals provided on the lower surface of a semiconductor device are connected with a plurality of pads provided on the upper surface of a mounting substrate, respectively, with solder or conductive adhesive.

During manufacturing, in the conventional structure such as the above-mentioned flip chip connecting structure, the solder or conductive adhesive is heated to about 200 degrees centigrade to melt the solder or to cure the conductive adhesive.

For example, when eutectic solder is used, the eutectic solder is heated to 183 degrees centigrade or higher. Heat is also applied to the semiconductor device and the mounting substrate. Because the thermal expansion coefficients of the semiconductor device and the mounting substrate are different from each other, the input/output terminals of the semiconductor device do not align with the pads of the mounting substrate after thermal expansion. When heating stops and/or cooling starts, the connecting members begin solidifying and making the input/output terminals of the semiconductor device connect to the pads of the mounting substrate, although there is a gap between positions of the input/output terminals of the semiconductor device and the pads of the mounting substrate. However, the semiconductor device and the mounting substrate contract, causing the input/output terminals and the pads to attempt to return to their original positions before the heating. This creates a problem because the connecting members are stressed when the semiconductor device, the solder, and the mounting substrate return to their ordinary temperature. When the stress exceeds the breaking stress of the connecting members, the connection between the input/output terminals and the pads breaks.

Stress produces another problem because it makes the semiconductor device and/or the mounting substrate warp or distort. In particular, when a printed substrate is used as the mounting substrate, the thermal expansion coefficient of the printed substrate is about $15 \times 10^{-6}/°$ C. to $20 \times 10^{-6}/°$ C. while that of a semiconductor device made of silicon is about 2.5 to $3.5 \times 10^{-6}/°$ C. Therefore, the difference between the thermal expansion coefficients of the printed substrate and of the semiconductor device is about 12 to $17 \times 10^{-6}/°C.$, and the stress lowers the reliability of the connection of the mounted parts. Therefore, because the difference between the thermal expansion coefficients of the printed substrate and the semiconductor device is large, stress produced to the connecting members becomes large.

In relatively small semiconductor devices the thermal expansion problem is not significant, however, as the size of the semiconductor device increases, differences between thermal expansion coefficients become a serious problem and the reliability of the devices is reduced.

Japanese Patent Application Laid-open No. Hei 8-148592 discloses a semiconductor integrated circuit device which has a semiconductor device mounted on a mounting substrate with solder bumps. The semiconductor integrated circuit device has a cap formed of a material having a thermal expansion coefficient being substantially equal to that of a semiconductor device and is secured on the upper surface of the semiconductor device. When the temperature changes due to heat generated from the semiconductor device, the semiconductor device and the cap expand and contract according to the thermal expansion coefficient of the semiconductor device. In this device, however, because the semiconductor device contracts according to the thermal expansion coefficient of the semiconductor device, the above problem of stress associated with the connecting members is not solved.

SUMMARY OF THE INVENTION

An object of the invention is to provide a mounting structure and a method of mounting a semiconductor device wherein a semiconductor device and a mounting substrate having different thermal expansion coefficients are connected to each other by connecting members, without applying stress to the connecting members.

Another object of the invention is to provide a mounting structure and a method of mounting a semiconductor device wherein reliability is improved when a semiconductor device having a large outer shape is mounted on a mounting substrate.

Another object of the invention is to provide a mounting structure and a method of mounting a semiconductor device wherein a printed substrate is used as the mounting substrate, the reliability of the connection between the printed substrate and the semiconductor device is improved.

According to one aspect of the present invention, a mounting structure for a semiconductor device is provided which includes: a substrate which has a first surface and a plurality of pads provided on the first surface; a semiconductor device which has first and second main surfaces and a plurality of terminals provided on the second main surface at locations corresponding to the pads; a plurality of connecting members which connect the pads to the terminals, respectively; and a member which has at least one surface which is coupled with the first main surface, wherein the thermal expansion coefficient of the member is equal to, or substantially equal to, that of the substrate.

According to another aspect of the present invention, a mounting structure for a semiconductor device is provided which includes: a substrate which has a first surface and a plurality of pads provided on the first surface; a semiconductor device which has first and second main surfaces and a plurality of terminals provided on the second main surface at locations corresponding to the pads; a plurality of connecting members which connect the pads with the terminals, respectively; a plate which is combined with the first main surface and has a thermal expansion coefficient being equal to, or substantially equal to, that of the substrate; and a cooling member which is thermally coupled with the plate.

According to another aspect of the present invention, a method for mounting a member and a semiconductor device on a substrate, wherein the member having at least one surface and the thermal expansion coefficient which is equal to, or substantially equal to, that of the substrate is provided which includes: coupling a surface of the member with the upper surface of the semiconductor device; positioning the semiconductor device so that terminals on a lower surface of the semiconductor device face pads on an upper surface of the substrate through connecting members, respectively; and heating the semiconductor device, the member, and the substrate to melt the connecting members, and thereafter, returning them to their ordinary temperature.

BRIEF DESCRIPTION OF THE DRAWINGS

Other features and advantages of the invention will be made more apparent by the following detailed description and the accompanying drawings, wherein.

In the drawings, the same reference numerals represent the same structural elements.

DETAILED DESCRIPTION OF THE PREFERRED EMBODIMENTS

A first embodiment of the present invention will be described in detail below.

Figure 1:
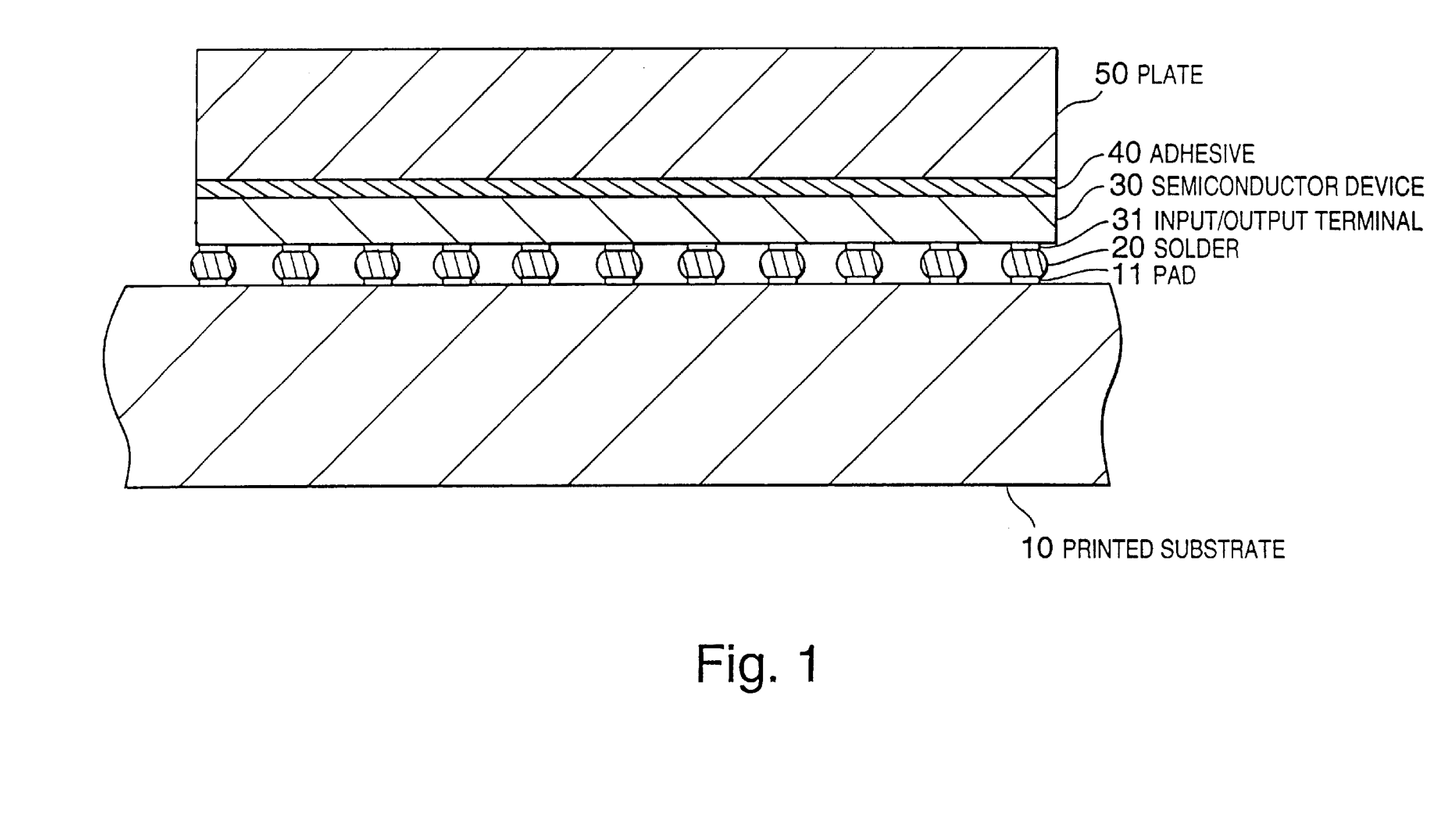
FIG. 1 is a sectional view of a first embodiment of the present invention.

Referring to FIG. 1, a mounting structure for a semiconductor includes a printed substrate 10, a semiconductor device 30, and a metal plate 50.

Printed substrate 10 has a plurality of pads 11. Pads 11 are provided on the upper surface of printed substrate 10 and are connected with wiring disposed on the surface or in an internal layer of printed substrate 10.

Semiconductor device 30 is mounted on the upper surface of printed substrate 10. Semiconductor device 30 is, for example, an integrated circuit (IC) or a large scale integration (LSI). Semiconductor device 30 has a plurality of input/output terminals 31. Input/output terminals 31 are provided on the lower surface of semiconductor device 30. Input/output terminals 31 are arranged in a lattice formation or the like. Input/output terminals 31 are each provided at locations corresponding to each of pads 11 on printed substrate 10, respectively. Input/output terminals 31 and the corresponding pads 11 are connected to each other by solder 20. Solder 20 is formed as solder balls.

Semiconductor device 30 is formed of silicon, and its thermal expansion coefficient is about $3 \times 10^{-6}/°$ C. The thickness of semiconductor device 30 is about 0.5 millimeters. The outer shape of semiconductor device 30 is a square with each side being about 12 millimeters long. The number of input/output terminals 31 is, for example, 800. The pitch of input/output terminals 31 is about 0.25 millimeters. The diameter of the terminal 31 is about 0.15 millimeters.

Metal plate 50 is coupled with the upper surface of semiconductor device 30. The thermal expansion coefficient of metal plate 50 is equal to, or substantially equal to, that of printed substrate 10. In this embodiment, metal plate 50 is made of copper or brass because the thermal expansion coefficients of copper and brass are $16.5 \times 10^{-6}/°$ C. and $17.3 \times 10^{-6}/°$ C., respectively, which are substantially equal to the thermal expansion coefficient of printed substrate 10 (15 to $20 \times 10^{-6}/°$ C.). As semiconductor device 30 becomes larger, it is preferable to use a material for metal plate 50 which has a thermal expansion coefficient close to the thermal expansion coefficient of semiconductor device 30. For example, when each side of semiconductor device 30 is about 10 millimeters long, there is no stress problem even if the difference of the thermal expansion coefficient between semiconductor device 30 and metal plate 50 is large. However, if each side is equal to or greater than about 20 millimeters long, it is preferable that the thermal expansion coefficient of metal plate 50 be substantially equal to that of semiconductor device 30 in order to avoid stress.

Metal plate 50 has an outer shape which is identical to the outer shape of semiconductor device 30 or has an outer shape which is larger than the outer shape of semiconductor 30. Metal plate 50 is strong enough to cause semiconductor device 30 to expand according to the thermal expansion of metal plate 50. However, if the strength of metal plate 50 is insufficient, metal plate 50 cannot cause semiconductor device 30 to expand according to the thermal expansion coefficient of metal plate 50, therefore, semiconductor device 30 expands according to the thermal expansion of the semiconductor device 30 itself not according to the thermal expansion of metal plate 50. Therefore, though it is preferable to make metal plate 50 as thin as possible, from the viewpoint of heat radiation, it is necessary that metal plate 50 be thick enough to cause semiconductor device 30 to expand according to the thermal expansion coefficient of metal plate 50. Specifically, the thickness of metal plate 50 is about 2 millimeters to 5 millimeters, and in this embodiment, about 3 millimeters.

Metal plate 50 and semiconductor device 30 are coupled to each other with a bonding strength sufficient to make semiconductor device 30 expand and contract according to the thermal expansion of metal plate 50, even after being heated and cooled. More specifically, metal plate 50 and semiconductor device 30 are coupled to each other by an adhesive 40. It is preferable to select adhesive 40 such that it provides the necessary adhesive strength to make semiconductor device 30 expand according to the thermal expansion of metal plate 50 when heated. In this embodiment, adhesive 40 is an epoxy adhesive. Sufficient adhesive strength can be obtained with any kind of epoxy adhesive. The thickness of an adhesive layer formed between metal plate 50 and semiconductor device 30 by adhesive 40 is about 10 to 20 microns.

Next, a method of mounting a semiconductor device will be described in detail.

First, semiconductor device 30 is prepared. Solder balls 20 are provided on input/output terminals 31 on the lower surface of semiconductor device 30, respectively. Depending on the kind of the mounting substrate on which semiconductor device 30 is mounted, a metal having a thermal expansion coefficient which is equal to, or substantially equal to, the thermal expansion coefficient of the mounting substrate is selected. Metal plate 50 is formed by forming the selected metal in a shape having a surface which is larger than, or equal in size to, the upper surface of semiconductor device 30.

Figure 2A:
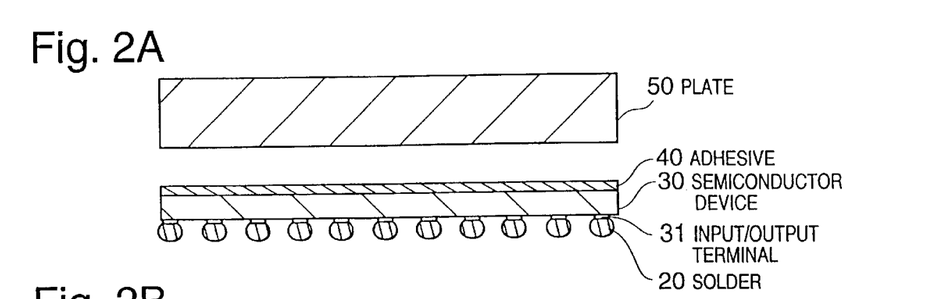
FIGS. 2A to 2D are illustrations showing a method of mounting a semiconductor device of the first embodiment of the present invention.

Referring to FIG. 2A, in a first step, epoxy adhesive 40 is applied on the upper surface of semiconductor device 30 to a thickness of about 10 to 20 microns. The upper surface of semiconductor device 30, with adhesive 40 applied thereon, and the lower surface of metal plate 50 are positioned facing each other. Note that adhesive 40 may be applied on the lower surface of metal plate 50.

Figure 2B:
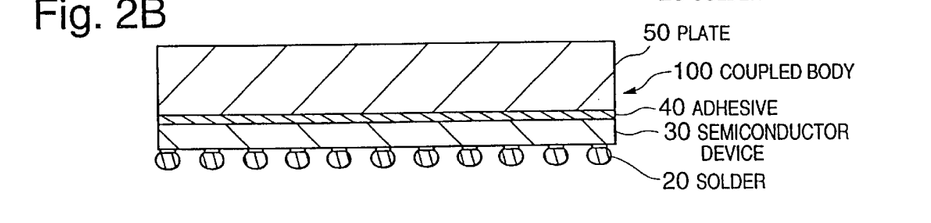

In FIG. 2B, in a second step, metal plate 50 is attached to semiconductor device 30 by adhesive 40 to form a coupled body 100. More specifically, the surface of 20 semiconductor device 30, with adhesive 40 applied thereon, is put in contact with the lower surface of metal plate 50. Heat is applied to semiconductor device 30, adhesive 40, and metal plate 50 to cure adhesive 40, and thus, semiconductor device 30 is adhered to metal plate 50.

Figure 2C:
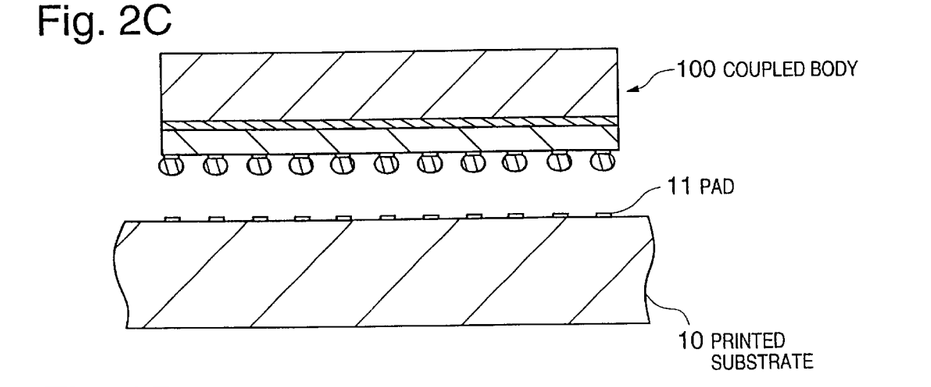

Referring to FIG. 2C, in a third step, coupled body 100 formed in the second step 25 is positioned above the upper surface of printed substrate 10, and is placed on printed substrate 10. Input/output terminals 31 on the lower surface of semiconductor device 30 are positioned on pads 11 on the upper surface of printed substrate 10, respectively.

Figure 2D:
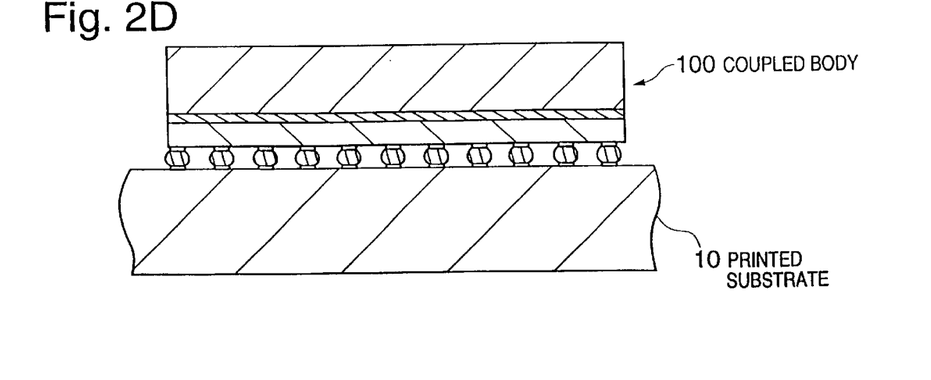

In FIG. 2D, in a fourth step, printed substrate 10, solder 20, semiconductor device 30, and metal plate 50 are heated. The heat causes thermal expansion of printed substrate 10, semiconductor device 30, and metal plate 50. Because semiconductor device 30 is coupled with metal plate 50, it expands according to the thermal expansion of metal plate 50 not according to the thermal expansion of semiconductor device 30 itself. The thermal expansion of semiconductor device 30 is also equal to, or substantially equal to, that of printed substrate 10 because the thermal expansion coefficient of printed substrate 10 is equal to, or substantially equal to, that of metal plate 50. Accordingly, even after the thermal expansion of printed substrate 10 and semiconductor device 30 due to the heating, the respective pads 11 and the corresponding input/output terminals 31 are not misaligned but are aligned. Or, the misalignment is so small that input/output terminals 31 and pads 11 may be considered to be substantially properly aligned.

When heating is stopped and/or cooling is started, melted solder 20 begins to solidify. Solder 20 connects input/output terminals 11 to pads 31 which are aligned or are considered to be substantially properly aligned. Printed substrate 10, semiconductor device 30, and metal plate 50 begin to contract as they get cooler. Also, in this cooling process, beccause semiconductor device 30 contracts according to the thermal expansion coefficient which is equal to, or substantially equal to, that of printed substrate 10, the respective pads and the corresponding input/output terminals 31 are not misaligned but are aligned. Or, the misalignment is so small that input/output terminals 31 and pads 11 may be considered to be substantially properly aligned. When printed substrate 10, solder 20, semiconductor device 30, and metal plate 50 return to their ordinary temperature and the connection between input/output terminals 31 and pads 11 is completed, no stress or almost no stress is applied to solder 20.

When heat generated from semiconductor device 30 causes thermal expansion of semiconductor device 30 and mounting substrate 10, because the thermal expansion of semiconductor device 30 and mounting substrate 10 is equal, or substantially equal, stress applied to the connecting members can be reduced.

In this embodiment, an organic substrate may be used instead of metal plate 50. When printed substrate 10 is used as the mounting substrate, a printed substrate is used as the organic substrate. Because the thermal expansion coefficient of the printed substrate coupled with semiconductor device 30 is equal to the thermal expansion coefficient of printed substrate 10, which is the mounting substrate, the reliability of the connection between semiconductor device 30 and printed substrate 10 can be further improved.

Further, a ceramic substrate may be used instead of printed substrate 10 in this embodiment. Because the thermal expansion coefficient of the ceramic substrate is about 6 to $7 \times 10^{-6}/°$ C., aluminum nitride, alumina ceramic, or tungsten is used as metal plate 50. This is because the thermal expansion coefficients of aluminum nitride, alumina ceramic, and tungsten are 3 to $4 \times 10^{-6}/°$ C., 4 to $6 \times 10^{-6}/°$ C., and 4 to $6 \times 10^{-6}/°$ C., respectively, which are substantially equal to that of the ceramic substrate. In this case, the reliability can be further improved.

In this embodiment, a conductive adhesive may be provided to connect pads 11 and input/output terminals 31, instead of solder 20.

Next, a second embodiment of the present invention will be described below. A feature of the second embodiment is that, instead of the metal plate, a cap is provided. The other structures are the same as those in the first embodiment.

Figure 3:
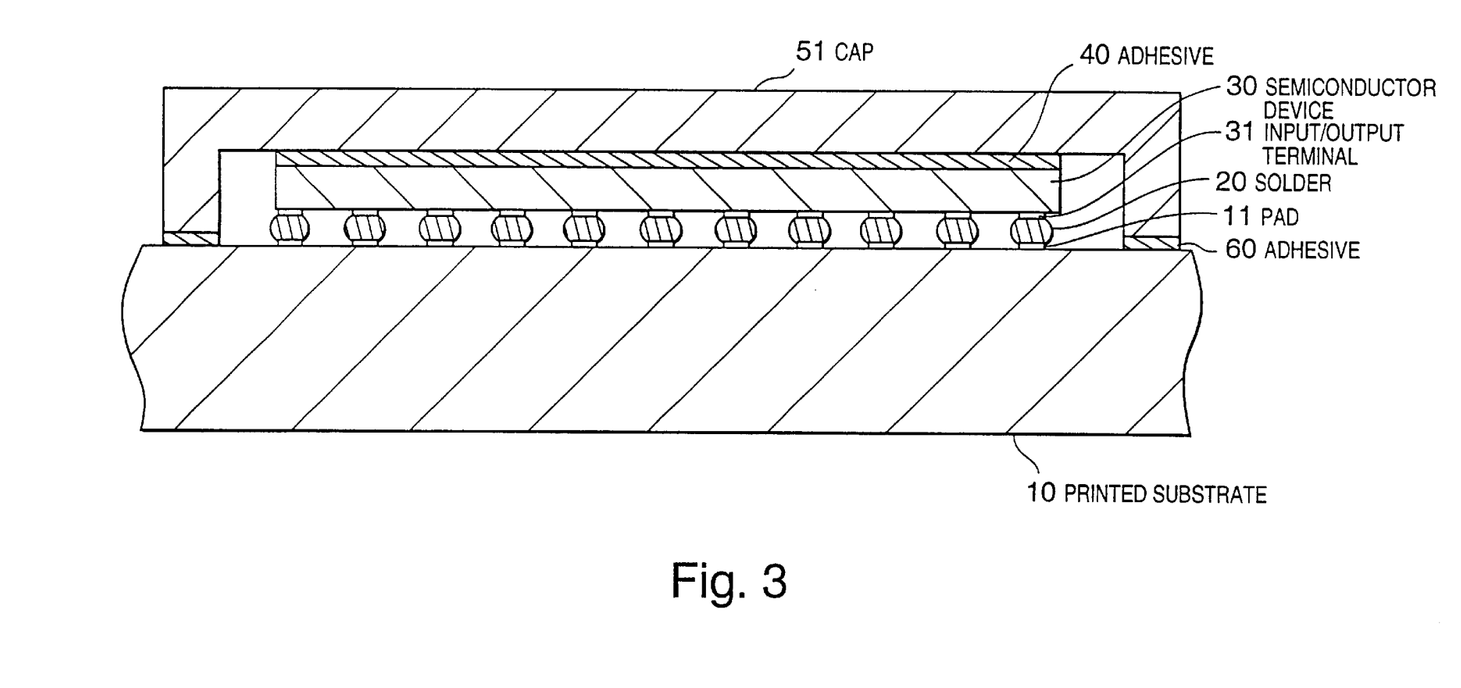
FIG. 3 is a sectional view of a second embodiment of the present invention.

Referring to FIG. 3, a cap 51 is provided on the upper surface of semiconductor device 30. Cap 51 has a concave portion, and the cross section thereof is shaped to be concave. The upper surface of semiconductor device 30 is adhered to the bottom surface of the concave portion by adhesive 40. The brim of cap 51 is adhered to the upper surface of printed substrate 10 by an adhesive 60. Semiconductor device 30 is completely encapsulated by cap 51, the adhesive 60, and printed substrate 10. The thermal expansion coefficient of cap 51 is equal to, or substantially equal to, the thermal expansion coefficient of printed substrate 10. The other structures of cap 51 are similar to those of metal plate 50 of the first embodiment.

In this embodiment, because cap 51, which has a thermal expansion coefficient equal to, or substantially equal to, that of printed substrate 10, is provided, a structure encapsulating semiconductor device 30 as well as preventing stress to solder 20 can be formed with a small number of parts. In addition, no stress is caused to the connecting portion between cap 51 and printed substrate 10.

In this embodiment, the connection between the brim of cap 51 and printed substrate 10 is not limited to only adhesive 60. A ring or other encapsulating members may be used.

Next, a third embodiment of the present invention will be described below. A feature of the third embodiment is that a metal plate includes a structure for attaching a cooling member. The other structures are the same as those in the first embodiment.

Figure 4:
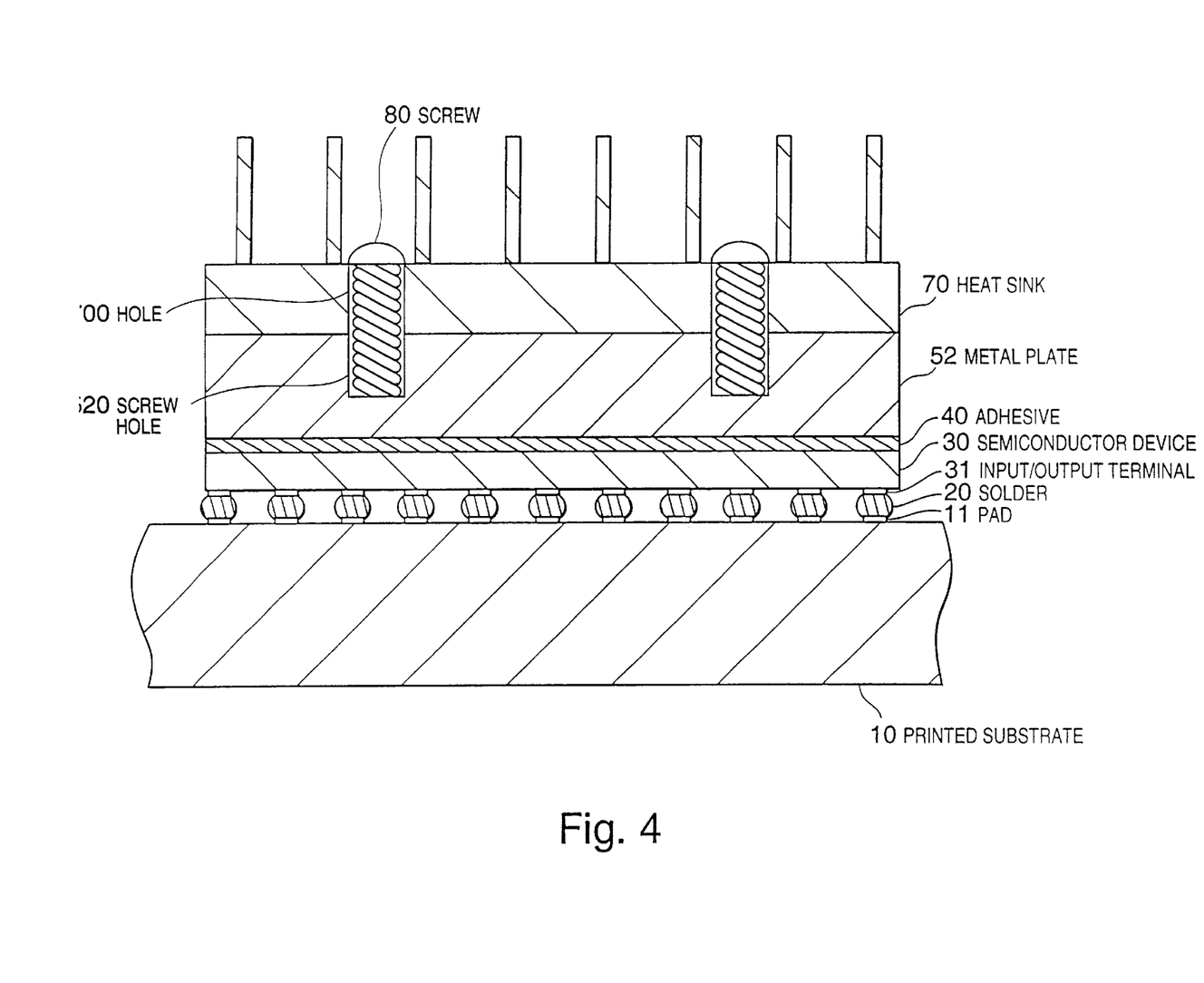
FIG. 4 is a sectional view of a third embodiment of the present invention.

Referring to FIG. 4, a mounting structure for a semiconductor device of the third embodiment includes a metal plate 52 and a heat sink 70.

Heat sink 70 is attached to the upper surface of metal plate 52 by screws 80. Screw holes 520 are provided in the upper surface of metal plate 52. The other structures of metal plate 52 are similar to those of metal plate 50 of the first embodiment. Holes 700 are provided in heat sink 70. Holes 700 are through holes and are provided at locations corresponding to the screw holes in metal plate 52. Screws 80 go through holes 700 in heat sink 70, respectively, and are screwed into screw holes 520 in metal plate 52, respectively.

As described above, in this embodiment, because the screw holes 520 are formed for attaching heat sink 70 to metal plate 52, it is not necessary to separately provide any attaching member for the heat sink.

Though holes 700 in heat sink 70 are through holes in this embodiment, however, they may also be screw holes.

Next, a fourth embodiment of the present invention will be described below. A feature of the fourth embodiment is that a metal plate is provided with a structure for attaching the cooling member thereto. The other structures are similar to those in the first embodiment.

Figure 5:
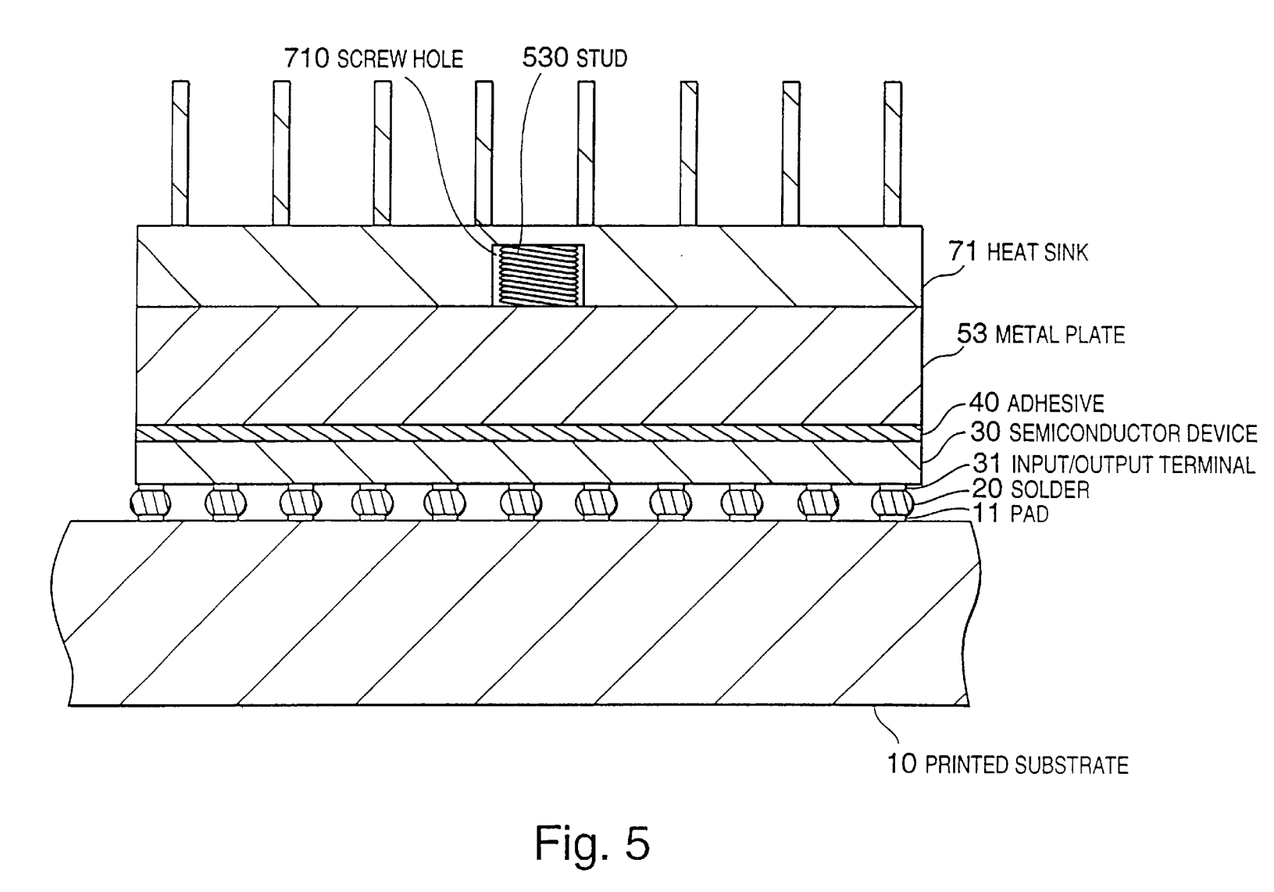
FIG. 5 is a sectional view of a fourth embodiment of the present invention.

Referring to FIG. 5, a mounting structure for a semiconductor device of the fourth embodiment includes a metal plate 53 and a heat sink 71. Heat sink 71 is attached to the upper surface of metal plate 53.

A stud 530 is provided on the upper surface of metal plate 53. A screw thread is provided on stud 530. A screw hole 710 is provided on the lower surface of heat sink 71. Screw hole 710 is provided at a location corresponding to stud 530 of metal plate 53 and stud 530 is screwed into the screw hole 710.

The effect of this embodiment is similar to that of the third embodiment.

Next, a fifth embodiment of the present invention will be described below. A feature of fifth embodiment is that, instead of a metal plate, a heat sink is used. The other structures are the same as those of the first embodiment.

Figure 6:
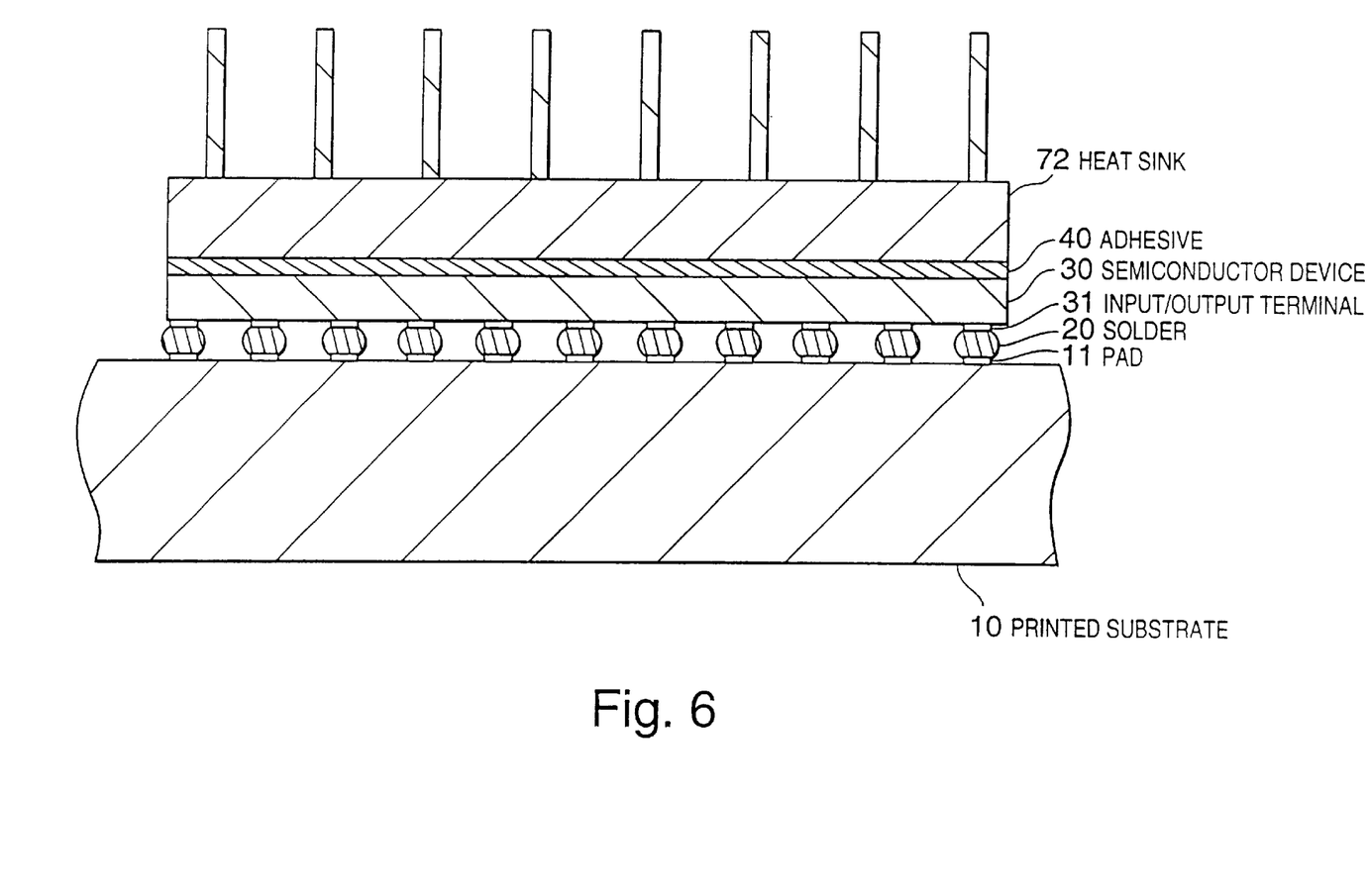
FIG. 6 is a sectional view of a fifth embodiment of the present invention.

Referring to FIG. 6, a heat sink 72 is attached to the upper surface of semiconductor device 30 by adhesive 40. Heat sink 72 is made of a metal which has excellent heat radiation. The thermal expansion coefficient of heat sink 72 is equal to, or substantially equal to, that of printed substrate 10. The other structures of heat sink 72 are similar to those of metal plate 50 of the first embodiment.

This embodiment is not limited to heat sink 72, and a metal member having at least one main surface may be applied. It is sufficient that the size of the at least one main surface of the metal member is larger than, or equal to, the size of the upper surface of semiconductor device 30. In this case, one main surface of the metal member is coupled with the upper surface of semiconductor device 30 by adhesive 40.

In this manner, because heat sink 72, which has a thermal expansion coefficient which is equal to, or substantially equal to, that of printed substrate 10, is coupled with the upper surface of semiconductor device 30, a structure radiating heat generated from semiconductor device 30, as well as preventing stress from being created to solder 20, can be achieved with a small number of parts.

The present invention can be applied to various kinds of mounting structures and methods for mounting a semiconductor device. For example, when the present invention is applied to a chip carrier, the metal plate or the organic plate is provided in a region corresponding to a region where connecting members are provided in the upper surface of a carrier substrate mounting a semiconductor thereon. Specifically, the metal plate or the organic plate is provided in a region of the upper surface of the chip carrier, except a region on which the semiconductor device is mounted.

While this invention has been described in conjunction with the preferred embodiments described above, it will now be possible for those skilled in the art to put this invention into practice in various other manners.

What is claimed is:

1. A mounting structure for a semiconductor device, comprising:
    a non-ceramic printed substrate which has a first surface and a plurality of pads on said first surface;
    a semiconductor device which has first and second main surfaces and plurality of terminals on said second main surface at locations corresponding to said pads;
    a plurality of connection members which connect said pads to said terminals, respectively;
    a member which has at least one surface which is coupled with said first main surface, wherein the thermal expansion coefficient of said member is substantially equal to the thermal expansion coefficient of said non-ceramic printed substrate, wherein said thermal expansion coefficient of said non-ceramic printed substrate is within the range of 15 to $20 \times 10^{-6}/°$ C.; and an adhesive layer which is provided between said semiconductor device and said member and which adheres said semiconductor device to said member with a bonding strength sufficient to expand and contract said semiconductor device with said member.

2. The mounting structure for a semiconductor device as claimed in claim 1, wherein said member comprises a metal plate.

3. The mounting structure for a semiconductor device as claimed in claim 1, wherein said member comprises an organic substrate.

4. The mounting structure for a semiconductor device as claimed in claim 1, wherein said substrate is a printed wiring substrate and said member is made of copper or brass.

5. The mounting structure for a semiconductor device as claimed in claim 1, wherein said substrate is a ceramic substrate and said member is made of aluminum nitride, alumina ceramic or tungsten.

6. The mounting structure for a semiconductor device as claimed in claim 1, wherein said member is strong enough to cause said semiconductor device to expand according to the thermal expansion of said member.

7. The mounting structure for a semiconductor device as claimed in claim 1, wherein said member is a heat sink.

8. The mounting structure for a semiconductor device as claimed in claim 1, wherein said member is a cap which encapsulates said semiconductor device together with said substrate.

9. A mounting structure for a semiconductor device, comprising:
    a non-ceramic printed substrate which has a first surface and a plurality of pads on said first surface;
    a semiconductor device which has first and second main surfaces and a plurality of terminals on said second main surface at locations corresponding to said pads;
    a plurality of connecting members which connect sad pads with said terminals, respectively;
    a plate which is coupled to said first main surface and has a thermal expansion coefficient substantially equivalent to said non-ceramic printed substrate, wherein said thermal expansion coefficient of said non-ceramic printed substrate is within the range of 15 to $20 \times 10^{-6}/°$ C.;
    a cooling member which is thermally coupled to said plate;
    an adhesive layer which is provided between said semiconductor device and said plate and which adheres said semiconductor device to said plate with a bonding strength sufficient to expand and contract said semiconductor device with said plate.

10. The mounting structure for a semiconductor device as claimed in claim 9, further comprising an attaching member on said plate for thermally attaching said cooling member to said member.

11. The mounting structure for a semiconductor device as claimed in claim 10, wherein said attaching member comprises a screw hole bored in said plate and a screw inserted in said screw hole.

12. The mounting structure for a semiconductor device as claimed in claim 10, wherein said attaching member comprises a stud.

* * * * *